(12) United States Patent
Wang et al.

(10) Patent No.: US 8,508,983 B2
(45) Date of Patent: Aug. 13, 2013

(54) NONVOLATILE STATIC RANDOM ACCESS MEMORY CELL AND MEMORY CIRCUIT

(75) Inventors: Min-Chuan Wang, Taichung (TW);
Pi-Feng Chiu, New Taipei (TW);
Shyh-Shyuan Sheu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/230,865

(22) Filed: Sep. 13, 2011

(65) Prior Publication Data

US 2012/0320658 A1   Dec. 20, 2012

(30) Foreign Application Priority Data

Jun. 15, 2011  (TW) .............................. 100120951 A

(51) Int. Cl.
*G11C 11/00* (2006.01)
(52) U.S. Cl.
USPC .......................................... 365/154; 365/148
(58) Field of Classification Search
USPC ................. 365/154, 156, 148, 158, 163, 171, 365/173, 185.07, 185.08
See application file for complete search history.

(56) References Cited

U.S. PATENT DOCUMENTS

| | | | | |
|---|---|---|---|---|
| 6,269,027 B1 * | 7/2001 | Hurst et al. | ............... | 365/189.05 |
| 6,515,895 B2 * | 2/2003 | Naji | ............... | 365/171 |
| 6,556,487 B1 * | 4/2003 | Ratnakumar et al. | ..... | 365/185.08 |
| 6,862,226 B2 * | 3/2005 | Toyoda et al. | ............ | 365/189.07 |
| 7,038,938 B2 * | 5/2006 | Kang | ............... | 365/148 |
| 7,110,293 B2 | 9/2006 | Jung | | |
| 7,149,104 B1 | 12/2006 | Horiuchi | | |
| 7,206,217 B2 * | 4/2007 | Ohtsuka et al. | ............... | 365/154 |
| 7,385,857 B2 | 6/2008 | Dalton | | |
| 7,599,210 B2 * | 10/2009 | Okazaki et al. | ............... | 365/148 |
| 7,692,954 B2 * | 4/2010 | Lamorey | ........................ | 365/154 |
| 7,760,538 B1 | 7/2010 | Paak | | |
| 7,791,941 B2 | 9/2010 | Hanafi | | |
| 7,903,451 B2 * | 3/2011 | Yamada et al. | ............... | 365/154 |
| 8,194,438 B2 * | 6/2012 | Ahn et al. | ...................... | 365/158 |
| 8,331,134 B2 * | 12/2012 | Chiu et al. | ..................... | 365/154 |
| 2009/0034312 A1 * | 2/2009 | Lawrence et al. | ............... | 365/51 |
| 2009/0034325 A1 * | 2/2009 | Lowrey et al. | ................. | 365/163 |
| 2010/0073991 A1 * | 3/2010 | Yamada et al. | ............... | 365/148 |

OTHER PUBLICATIONS

Chiu et al., "U.S. Appl. No. 12/853,301", filed on Aug. 10, 2010, p. 1-p. 46.

(Continued)

*Primary Examiner* — Harry W Byrne
*Assistant Examiner* — Lance Reidlinger
(74) *Attorney, Agent, or Firm* — Jianq Chyun IP Office

(57) ABSTRACT

A non-volatile static random access memory (NVSRAM) cell including a static random access circuit, first storage device, a second storage device, and a switch unit is provided. The static random access circuit has a first terminal and a second terminal respectively having a first voltage and a second voltage. Stored data in the first storage device and the second storage device are determined by the first voltage and the second voltage. The first storage device and the second storage device respectively have a first connection terminal and a second connection terminal. The switch unit is respectively coupled to the second connection terminals of the first storage device and the second storage device, and is controlled by a switching signal of a switch line to conduct the first storage device and the second storage device to a same bit line or a same complementary bit line.

16 Claims, 11 Drawing Sheets

(56) References Cited

OTHER PUBLICATIONS

T. Miwa et al., "NV-SRAM: A Nonvolatile SRAM with Backup Ferroelectric Capacitors", IEEE Journal of Solid-State Circuits, vol. 36, No. 3, Mar. 2001, p. 522-p. 527.

M. Takata et al., "Nonvolatile SRAM based on Phase Change", 21st IEEE Non-Volatile Semiconductor Memory Workshop 2006, NVSMW 2006, p. 95-p. 96.

M. Fliesler et al., "A 15ns 4Mb NVSRAM in 0.13u SONOS Technology", Non-Volatile Semiconductor Memory Workshop, 2008 and 2008 International Conference on Memory Technology and Design. NVSMW/ICMTD 2008. Joint, p. 83-p. 86.

Yamamoto et al., "Nonvolatile SRAM (NV-SRAM) Using Functional MOSFET Merged with Resistive Switching Devices", IEEE 2009 Custom Intergrated Circuits Conference (CICC), p. 531-534.

N. Sakimura et al., "Nonvolatile Magnetic Filip-Flop for Standby-Power-Free SoCs", IEEE Journal of Solid-State Circuits, vol. 44, No. 8, Aug. 2009, p. 2244-p. 2250.

Hur et al., "Nonvolatile SRAM cell using different capacitance loading", Electronics Letters Feb. 5, 1998 vol. 34 No. 3, p. 251-p. 253.

Wang et al., "Nonvolatile SRAM Cell", Electron Devices Meeting, 2006. IEDM '06. International, p. 1-p. 4.

\* cited by examiner

NONVOLATILE STATIC RANDOM ACCESS MEMORY CELL AND MEMORY CIRCUIT

CROSS-REFERENCE TO RELATED APPLICATION

This application claims the priority benefit of Taiwan application serial no. 100120951, filed Jun. 15, 2011. The entirety of the above-mentioned patent application is hereby incorporated by reference herein and made a part of this specification.

BACKGROUND

1. Technical Field

The disclosure relates to a non-volatile static random access memory cell and a memory circuit.

2. Related Art

Various digital logic circuits, memories and analog circuits are integrated in a system on chip (SOC) in order to greatly improve a circuit operating speed and functions thereof. Along with functional diversification of electronic products, memory capacity is gradually increased. A static random access memory (SRAM) is a memory with a high accessing speed and low operating voltage. However, when the chip enters a standby mode, in order to preserve the stored data, the SRAM has to be continually powered to compensate current leakage, so as to avoid data error and maintain the stored data. In this case, power consumption caused by the current leakage of the SRAM cannot be ignored. As the CMOS technology scaling down, the leakage issue is getting much more serious along with the increased memory capacity, which results in large static power consumption. In order to avoid unnecessary power consumption and maintain the stored data in case of power-off or the standby mode, a non-volatile memory (NVM) can be used, and a power supply of the NVM can be completely cut off to achieve zero power consumption. However, the existing products or products under development of the NVM are not yet up to an operating speed of the SRAM level.

If the SRAM cell 50 is integrated with the NVM device, a novel non-volatile SRAM (NVSRAM) cell is obtained. During a normal operation, only the SRAM part in the NVSRAM cell is used to perform high accessing speed and low-voltage read/write operation. In case of the standby mode or power off, data can be written in the NVM device in advance before the standby mode or power off, then it is unnecessary to supply power to the NVSRAM cells, so as to avoid the power consumption caused by current leakage. To return back to a normal operation, a recall operation is performed to restore the pre-stored data from the NVM device to the SRAM cell 50. Then, the NVSRAM is operated as a general SRAM and is accessed with a high speed, which does not influence a normal operation of the SRAM.

FIG. 1 is a circuit schematic diagram of a conventional NVSRAM, in which resistive switching devices (RSDs) are used as non-volatile storage devices.

Referring to FIG. 1, the NVSRAM is implemented through a conventional six-transistor structure based on a SRAM, in which besides transistors 100 and 102 are respectively coupled to a bit line BL and a complementary bit line BLB, each of inverters 104 and 106 has two transistors (not shown in FIG. 1). Gates of the two transistors 100 and 102 are coupled to a write line WL. The two inverters 104 and 106 are respectively coupled in series between the two transistors 100 and 102.

A storage node Q is connected to a transistor 108 and a resistive-switching device R1, and another storage node QB is connected to a transistor 110 and a resistive-switching device R2 to form a non-volatile storage part, and other terminals of the two resistive-switching devices R1 and R2 are commonly connected to a control line CTRL. Gates of the transistors 108 and 110 are respectively coupled to a switch line SW.

During a read/write operation of the static access memory, a voltage of the switch line SW is set at a low level, so that the transistors 108 and 110 are turned off to block a connection between the SRAM and the resistive-switching devices R1 and R2, and now the SRAM can be accessed according to a general operation method. When information of the storage nodes is backup to the resistive-switching devices, if the non-volatile device is a unipolar device, a voltage level of the switch line SW is increased to 0.7V, and a voltage level of the control line CTRL is increased to 1.8V, so that the resistive-switching device R2 of the storage node (for example, the storage node QB) has a cross voltage for transiting to a low resistance state (LRS), which is referred to as a SET operation. Then, the power can be turned off. During a recall operation, the voltage level of the switch line SW is set to a high level, and a magnitude of a charging current of the storage node is determined according to a resistance magnitude of R1/R2, and a latch circuit formed by the two inverters 104 and 106 latches the voltage level of Q/QB. After the recall operation is ended, the resistive-switching device R2 is written back to the high resistance state, and the voltage level of the switch line SW is 1.2V and the voltage level of the control line CTRL is 1.2V. Then, it returns to the state for the read/write operation of the SRAM. The operation of writing back the device to the high resistance state is also referred to as a RESET operation. If the non-volatile device is a bipolar device, the voltage level of the switch line SW is increased to 1.8V, and the control line CTRL sequentially provides voltage levels of 1.8V and 0V to respectively generate a positive bias for SET operation and a negative bias for RESET operation.

In such conventional structure, besides the transistors 108 and 110 are required, the resistive-switching devices R1 and R2 are required to be connected to the external control line CTRL, which may increase a layout area. Moreover, when the conventional structure of a unipolar resistive-switching device is used, since the voltage level of the switch line SW is required to be adjusted to control storage of the unipolar resistive-switching device, and the RESET operation is performed after the recall operation, a booting time is influenced.

SUMMARY

The disclosure provides a non-volatile static random access memory cell including a static random access circuit, a first storage device, a second storage device, and a switch unit. The static random access circuit has a first terminal and a second terminal respectively having a first voltage and a second voltage. Stored data in the first storage device and the second storage device are determined by the first voltage and the second voltage. The first storage device has a first connection terminal and a second connection terminal, and the first connection terminal is coupled to the first terminal. The second storage device has a first connection terminal and a second connection terminal, and the first connection terminal is coupled to the second terminal. The switch unit is respectively coupled to the second connection terminals of the first storage device and the second storage device, and is controlled by a switching signal of a switch line to conduct the first storage device and the second storage device to a same bit line or a same complementary bit line.

In order to make the aforementioned and other features of the invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
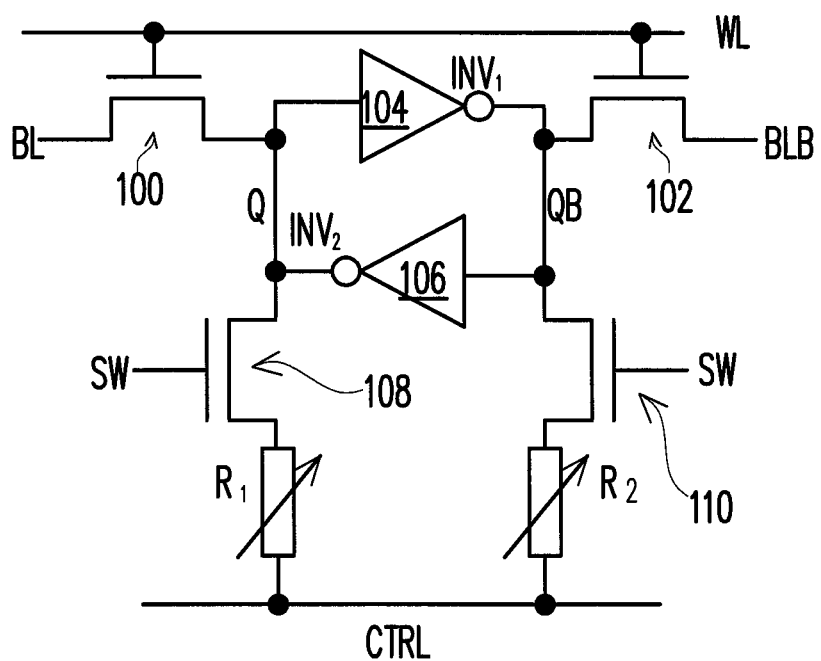
FIG. 1 is a circuit schematic diagram of a conventional non-volatile static random access memory (NVSRAM), in which unipolar resistive switching devices (RSDs) are used as non-volatile storage devices.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Accordingly, the disclosure is directed to a non-volatile static random access memory cell, which has a less utilization area and low power consumption, and is capable of avoiding current leakage and reducing a load on a bit line.

Figure 2:
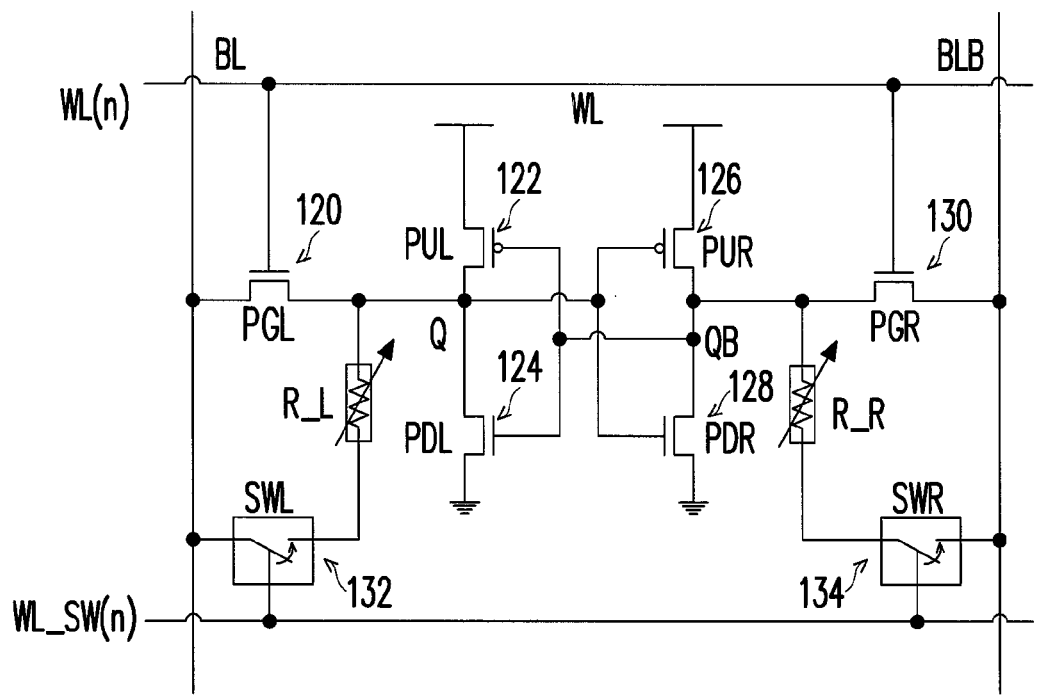
FIG. 2 is schematic diagram of an initial structure of a non-volatile static random access memory (NVSRAM) cell according to an exemplary embodiment.

The disclosure first provides an operation mechanism without using an external control line CTRL, FIG. 2 is schematic diagram of an initial structure of a non-volatile static random access memory (NVSRAM) cell according to an exemplary embodiment. FIG. 2 illustrates a structure provided by the disclosure, and details of the disclosure are described below.

Referring to FIG. 2, in the exemplary embodiment, bipolar resistive-switching devices are used as non-volatile storage devices. The SRAM cell 50 of the exemplary embodiment includes six transistors PGL120, PUL122, PDL124, PUR126, PDR128 and PGR130. Storage nodes Q and QB of a latch circuit are respectively connected to transistors SWL132 and SWR134 and resistive-switching devices R_L and R_R, wherein the non-volatile storage memory cell includes the transistors SWL132 and SWR134 and the resistive-switching devices R_L and R_R. The transistors SWL132 and SWR134 serve as switch devices. The resistive-switching devices R_L and R_R are respectively connected to a bit line BL(n) and a complementary bit line BLB(n) through the switch devices 132 and 134, where switching signals of the switch devices 132 and 134 are provided by a switch line WL_SW(n). The storage nodes Q and QB are respectively a first terminal and a second terminal of the latch circuit.

The structure of FIG. 2 is a memory cell of a NVSRAM. However, as a memory capacity is increased along with a requirement of the electronic products, a parasitic RC value of the bit line BL/the complementary bit line BLB becomes greater, which may influence a read time of the NVSRAM. A further design is provided below by the disclosure.

Figure 3:
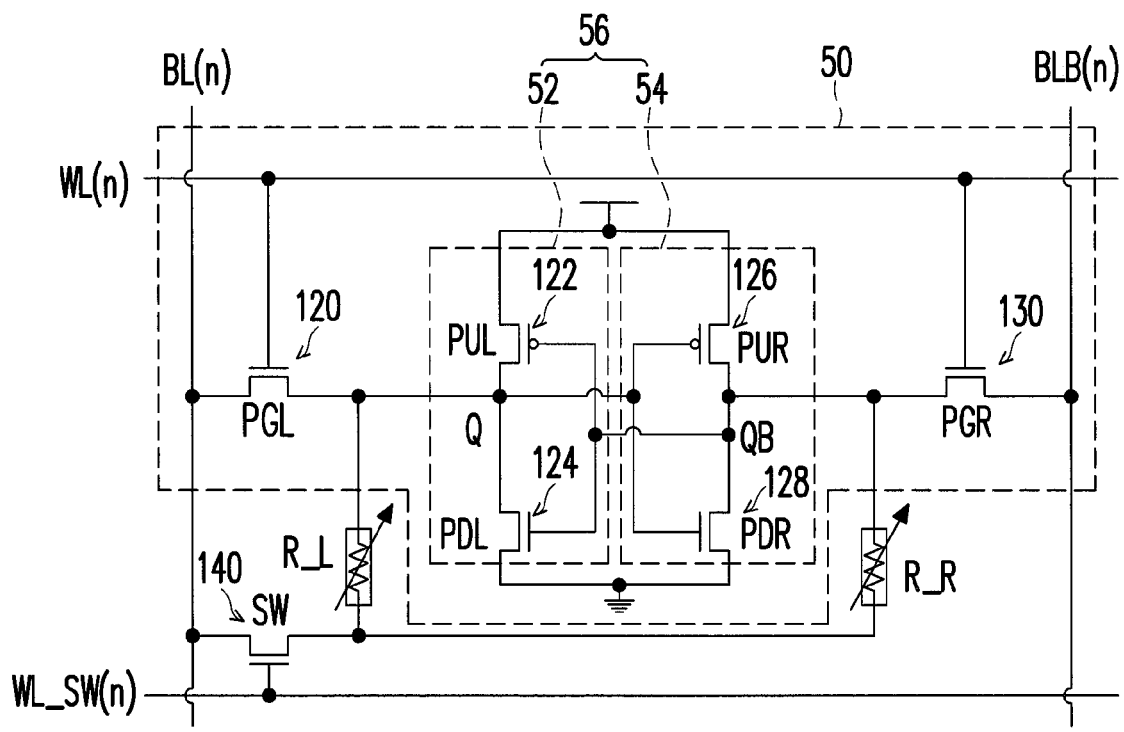
FIG. 3 is schematic diagram of a circuit structure of a memory cell of the NVSRAM according to an exemplary embodiment.

FIG. 3 is schematic diagram of a circuit structure of a memory cell of the NVSRAM according to another exemplary embodiment. Referring to FIG. 3, the memory cell of the exemplary embodiment includes seven transistors. Structures and functions of the transistors PGL120, PUL122, PDL124, PUR126, PDR128 and PGR130 are as that of the aforementioned SRAM cell 50 consisted of six transistors. The SRAM cell 50 includes a latch circuit unit 56, which may include two inverters 52 and 54 connected in series in a loop. The inverters 52 and 54, for example, respectively include two transistors with different conductivities.

The storage nodes Q and QB are respectively connected to the resistive-switching devices R_L and R_R. The resistive-switching devices R_L and R_R may have a bipolar design or a unipolar design, which can all be used regardless of a difference of operation sequences. The difference of the operation sequences is described later.

The static random access circuit of the disclosure is not limited to be formed by six transistors, and other types of the static random access circuit that requires two storage nodes to determine accessed data can also be used. Moreover, the resistive-switching devices R_L and R_R used for storing the data information of the storage nodes Q and QB are used as an example for description. The resistive-switching devices R_L and R_R are storage devices. Besides the resistive-switching devices, the storage devices used by the storage nodes Q and QB can also be phase-change memories (PCMB) or magnetoresistive RAMs (MRAMs), etc. Generally, the storage device may have two electrical states for storing data according to a bias applied thereon. The non-volatile storage devices are used for storing data of the SRAM cell 50 before the power is turned off and recall the stored data after the power is turned on.

One terminals of the resistive-switching devices R_L and R_R are coupled to a transistor SW140, and the transistor SW140 is coupled to the bit line BL(n) or the complementary bit line BLB(n). In the exemplary embodiment, the transistor SW140 is, for example, coupled to the bit line BL(n). The transistor SW140 serves as a switch device (hereinafter, the transistor SW140 is referred to as a switch device 140), and a gate thereof is connected to the switch line WL_SW(n) and is controlled by a switching signal to turn on/off the switch device 140. A SET operation and a RESET operation can be performed according to a voltage of the bit line BL(n) and/or the complementary bit line BLB(n). Since the voltages on the storage nodes Q and QB are different, data to be stored can be written on the two resistive-switching devices R_L and R_R. Resistances of the resistive-switching devices R_L and R_R can be different according to different bias directions, so that two resistance states are respectively stored. Based on the stored resistances states, charging currents of different magnitudes can be generated when power is recovered, so that the data is recovered to the two storage nodes Q and QB.

In the exemplary embodiment, seven transistors (7T) are used. Six transistors PGL120, PUL122, PDL124, PUR126, PDR128 and PGR130 in the 7T memory cell form a memory cell of the SRAM 50. The resistive-switching devices R_L and R_R are resistive non-volatile memory devices and the switch device 140 serves as a switch for accessing the resistive-switching devices R_L and R_R. The switch device 140 can be an N-type metal-oxide-semiconductor transistor (NMOS), a P-type metal-oxide-semiconductor transistor (PMOS), a bipolar junction transistor (BJT) or a diode, etc. The switch devices in the following embodiments can be transistors of the same type. One connection terminals of the resistive-switching devices R_L and R_R are respectively connected to the two storage nodes Q and QB of the memory cell, and other connection terminals of the resistive-switching devices R_L and R_R are commonly connected to the switch device 140. Namely, the other connection terminals of the resistive-switching devices R_L and R_R are commonly connected to a drain of the switch device 140, and a source of the switch device 140 is connected to the bit line BL(n), and a gate of the switch device 140 is connected to the switch line WL_SW(n) for receiving a switching signal to turn on/off the switch device 140. Alternatively, the other connection terminals of the resistive-switching devices R_L and R_R are commonly connected to the source of the switch device 140, and the drain of the switch device 140 is connected to the bit line BL(n), and the gate of the switch device 140 is connected to the switch line WL_SW(n) for receiving the switching signal to turn on/off the switch device 140.

In the memory cell of the exemplary embodiment, the resistive-switching devices are connected to the bit line BL or the complementary bit line BLB. Therefore, one switch device 140 is set to turn on/off the SRAM and the non-volatile storage memory cell, by which an area of the memory cell can be reduced.

The storage nodes Q and QB are respectively a first terminal and a second terminal of the latch circuit.

The NVSRAM cell of the disclosure includes a SRAM circuit, a first storage device, for example is a first resistive-switching device R_L, a second storage device, for example is a second resistive-switching device R_R and a switch unit. The SRAM circuit has a first terminal and a second terminal, and the first terminal and the second terminal respectively has a first voltage and a second voltage, and stored data in the first resistive-switching device R_L and the second resistive-switching device R_R are determined by the first voltage value and the second voltage value, where the first terminal is the storage node Q, and the second terminal is the storage node QB. The first resistive-switching device R_L has a first connection terminal and a second connection terminal, wherein the first connection terminal is coupled to the first terminal, Q. The second resistive-switching device R_R has a first connection terminal and a second connection terminal, wherein the first connection terminal is coupled to the second terminal, QB. The drain of the switch unit is respectively coupled to the second connection terminals of the first resistive-switching device R_L and the second resistive-switching device R_R. The gate of the switch unit is coupled to the switch line WL_SW(n) for receiving the switching signal to turn on/off the switch unit. The source of the switch unit is coupled to the bit line BL(n) or the complementary bit line BLB(n). The switch unit can be a switch device 140.

Alternatively, the source of the switch unit is respectively coupled to the second connection terminals of the first resistive-switching device R_L and the second resistive-switching device R_R, the gate of the switch unit is coupled to the switch line WL_SW(n) for receiving the switching signal to turn on/off the switch unit, and the drain of the switch unit is coupled to the bit line BL(n) or the complementary bit line BLB(n).

Further, the SRAM circuit includes a latch circuit unit 56 and two transistors 120 and 130. The latch circuit unit 56 has a first terminal (Q) and a second terminal (QB), and is used for latching the voltage values of the resistive-switching devices R_L and R_R.

Figure 4:
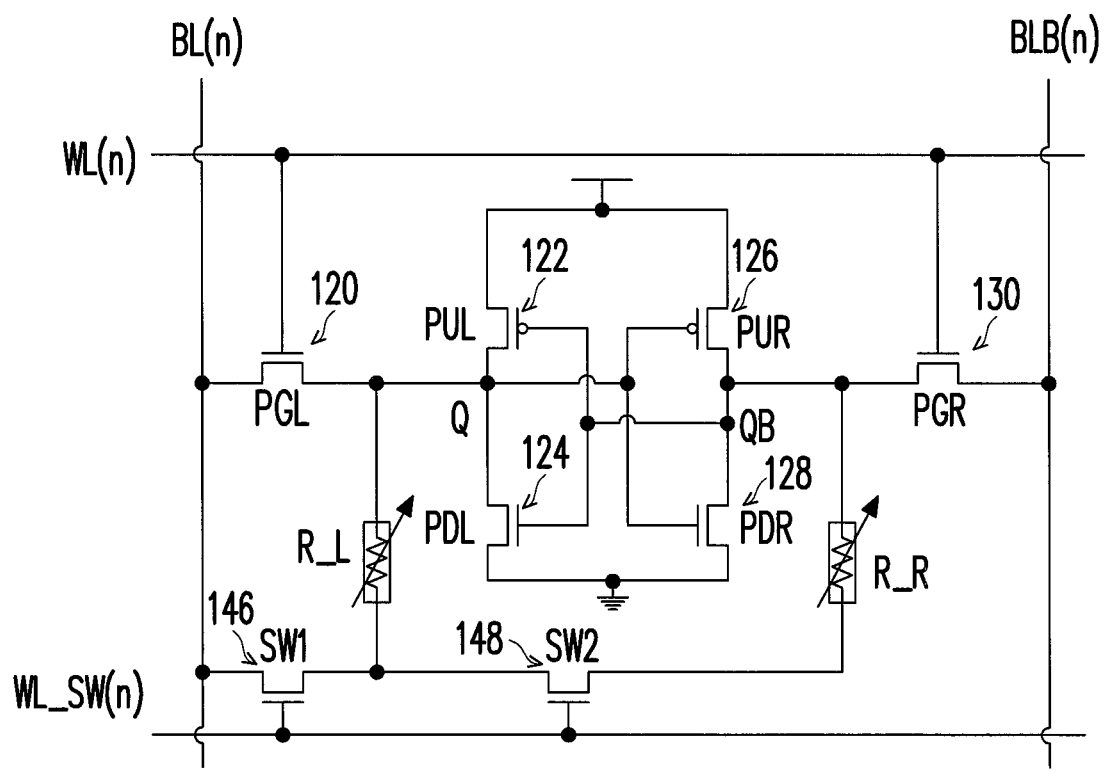
FIG. 4 is a schematic diagram illustrating a circuit structure of a memory cell of the NVSRAM according to an exemplary embodiment.

FIG. 4 is a schematic diagram illustrating a circuit structure of a memory cell of the NVSRAM according to an exemplary embodiment. Referring to FIG. 4, the memory cell of the exemplary embodiment includes eight transistors (8T) and two resistive-switching devices R_L and R_R, wherein functions of the six transistors PGL120, PUL122, PDL124, PUR126, PDR128 and PGR130 and the two resistive-switching devices R_L and R_R are as that described in the aforementioned exemplary embodiment. Moreover, two transistors SW1 and SW2 serve as switch devices 146 and 148 (the transistors SW1 and SW2 are referred to as the switch devices 146 and 148 hereinafter). The first connection terminals of the resistive-switching devices R_L and R_R are respectively connected to the first terminal Q and the second terminal QB. The switch device 146 is connected between the second connection terminal of the resistive-switching device R_L and the bit line BL(n). The switch device 148 is connected between the second connection terminals of the resistive-switching devices R_L and R_R.

In the aforementioned embodiment, the switch device 140 of FIG. 3 and the switch device 146 of FIG. 4 are all connected to the bit line BL(n), though the disclosure is not limited thereto, and the switch device 140 of FIG. 3 and the switch device 146 of FIG. 4 can also be connected to the complementary bit line BLB(n). A combination of the two connecting methods is described later with reference of FIG. 5-FIG. 8.

In the exemplary embodiment, the switch device 146 and the switch device 148 can be simultaneously turned on or turned off. For example, when the switch device 148 is turned off, the resistive-switching devices R_L and R_R are disconnected, so as to avoid a direct current path during none operation. In the structure of FIG. 3, the resistive-switching devices R_L and R_R are maintained conducted, which may still produce a direct current path during none operation.

In the aforementioned embodiments, the switch unit can be any switch devices, like PMOS, NMOS, BJT and diode, which couples the connection terminals of the resistive-switching devices R_L and R_R to one of the bit line BL(n) and the complementary bit line BLB(n). Regarding an overall configuration of a memory cell array, and considering a load balance between the bit line BL(n) and the complementary bit line BLB(n) to conform the discharge voltage on BL(n) and BLB(n), which will be further amplified by sensing amplifiers, in order to conform the sensing time and ensure a correct sensing operation, a mixed structure of two types of the memory cells is provided below.

Figure 5:
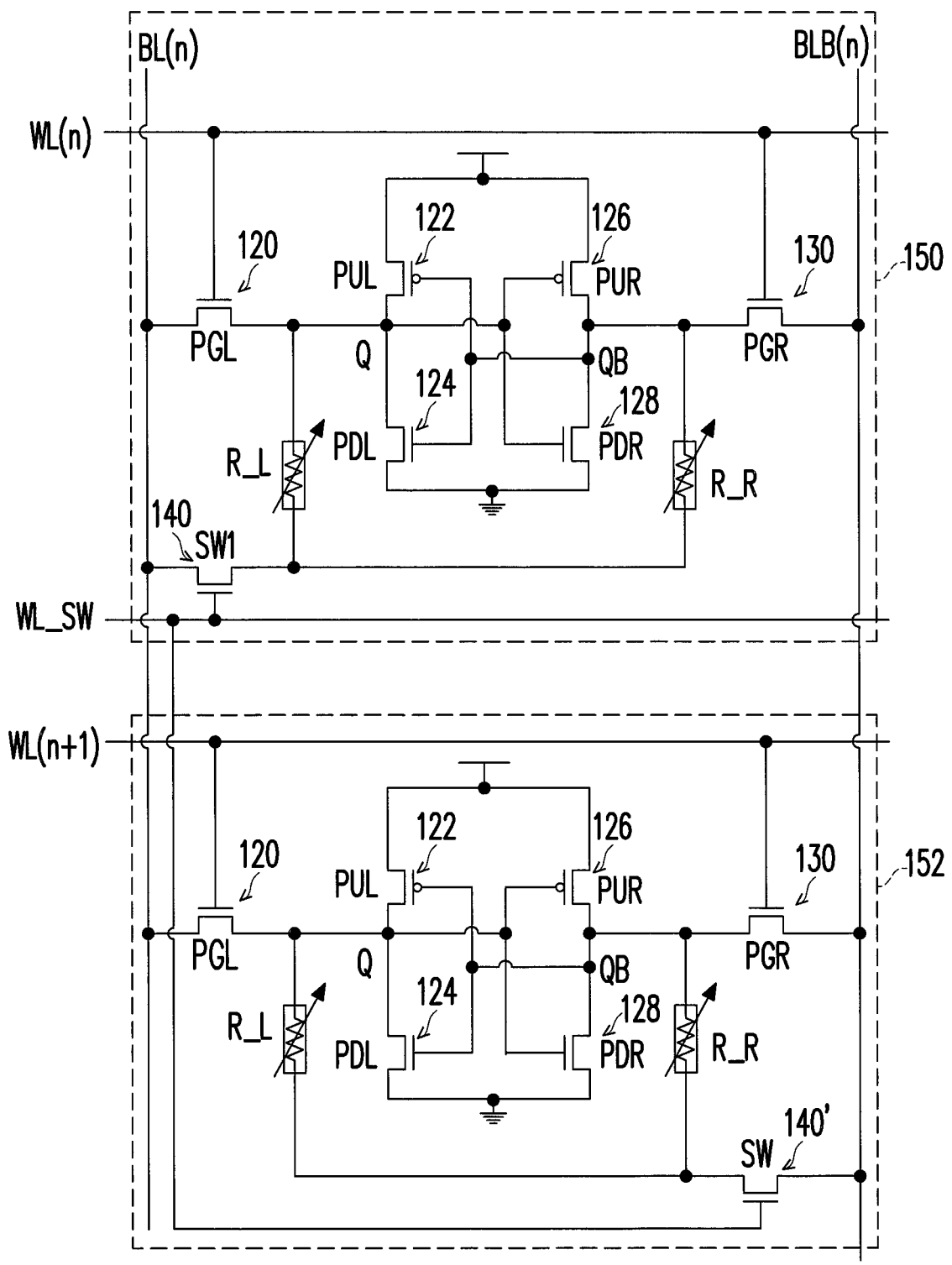
FIG. 5 is a schematic diagram of a NVSRAM circuit according to an exemplary embodiment.

FIG. 5 is a schematic diagram of a NVSRAM circuit according to an exemplary embodiment. Referring to FIG. 5, based on the memory cell of FIG. 3, the resistive-switching devices R_L and R_R of two adjacent memory cells 150 and 152 are respectively connected to the bit line BL(n) and the complementary line BLB(n).

Namely, regarding the whole memory array, a memory cell string is connected between the bit line BL(n) and the complementary bit line BLB(n), and the memory cell string includes the mixed structure of the two types of the memory cells. One type of the memory cell is the memory cell 150, in which the resistive-switching devices R_L and R_R are connected to the bit line BL(n), and another type is the memory cell 152, in which the resistive-switching devices R_L and R_R are connected to the complementary bit line BLB(n). The memory cells 150 and 152 connected between the bit line BL(n) and the complementary bit line BLB(n) are respectively coupled to two adjacent word lines WL(n) and WL(n+1). Therefore, the memory cells 150 and 152 are arranged in alternation along a direction of the bit line.

In other words, in the memory cell 150 controlled by the word line WL(n), one connection terminals of the resistive-switching devices R_L and R_R are respectively connected to the storage node Q and the storage node QB. The other connection terminals of the resistive-switching devices R_L and R_R are connected to the source of the switch device 140. The drain of the switch device 140 is connected to the bit line BL(n), and the gate thereof is connected to the switch line WL_SW for receiving a switching signal to turn on/off the switch device 140.

In the memory cell 152 controlled by the word line WL(n+1), one connection terminals of the resistive-switching devices R_L and R_R are respectively connected to the storage node Q and the storage node QB. The other connection terminals of the resistive-switching devices R_L and R_R are connected to the drain of the switch device 140'. The source of the switch device 140' is connected to the complementary bit line BLB(n), and the gate thereof is connected to the switch line WL_SW for receiving a switching signal to turn on/off the switch device 140'. In the exemplary embodiment, the switch line WL_SW is, for example, shared by the two memory cells 150 and 152. However, the memory cells 150 and 152 can also be respectively switched by different switch lines. Further, according to an actual design requirement, the switch line WL_SW can be shared by a plurality of memory cells, namely, one switch line WL_SW can be shared by two or more memory cells.

Figure 6:
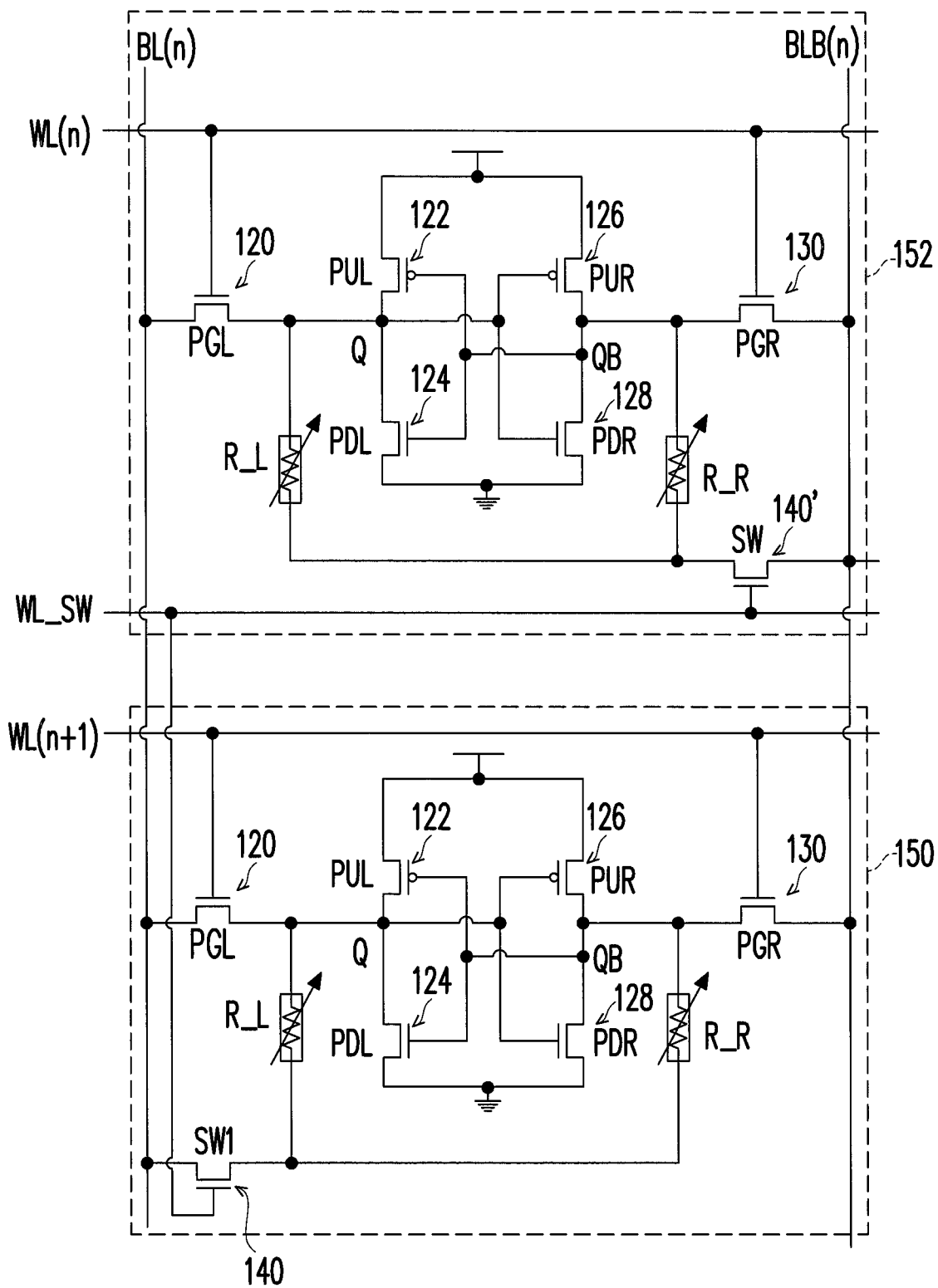
FIG. 6 is a schematic diagram of a NVSRAM circuit according to an exemplary embodiment.

FIG. 6 is a schematic diagram of a NVSRAM circuit according to an exemplary embodiment. Referring to FIG. 6, a structure of the NVSRAM circuit of the exemplary embodiment is similar to that of FIG. 5, though positions the memory cell 150 and the memory cell 152 are exchanged.

Figure 7:
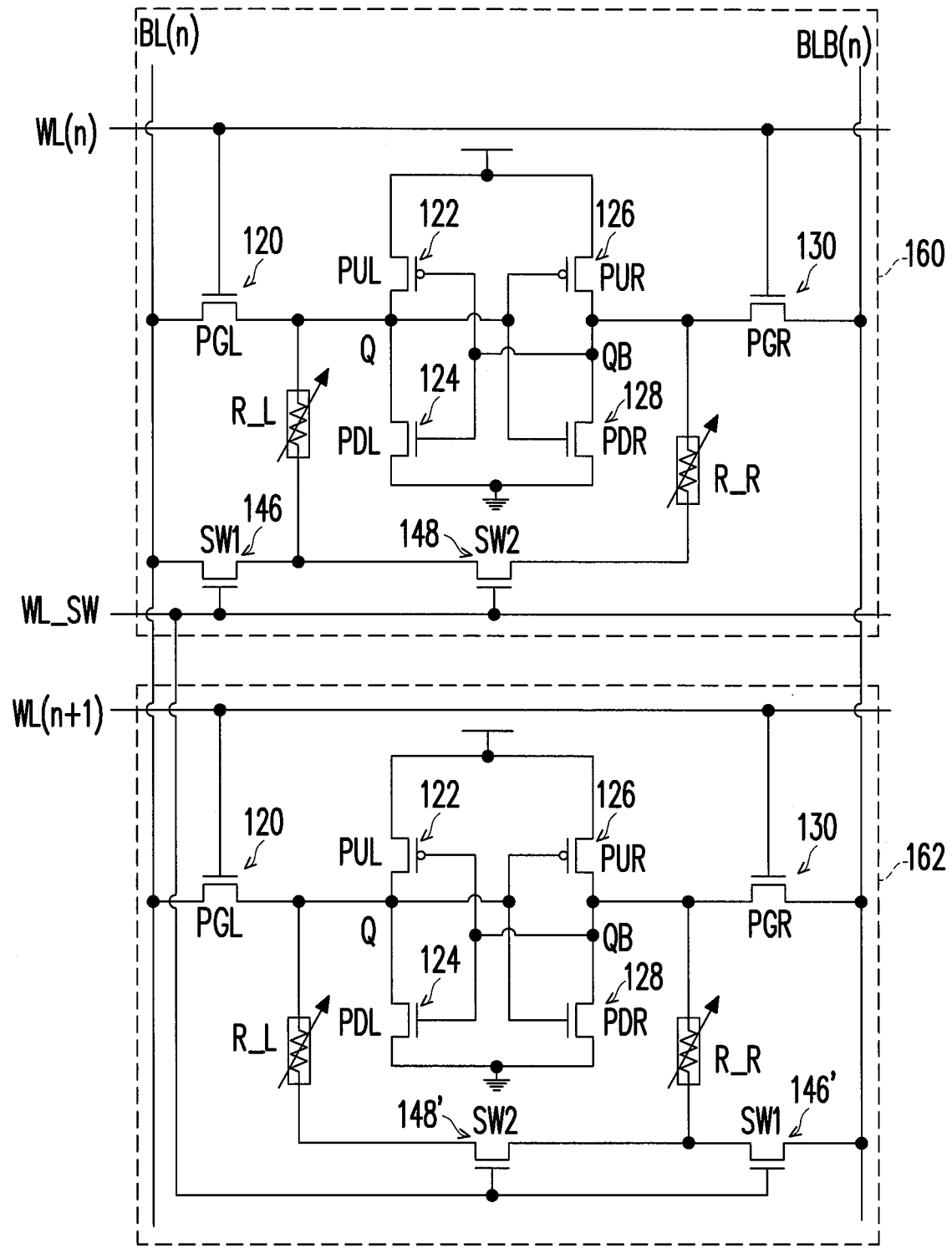
FIG. 7 is a schematic diagram of a NVSRAM circuit according to an exemplary embodiment.

FIG. 7 is a schematic diagram of a NVSRAM circuit according to an exemplary embodiment. Referring to FIG. 7, the NVSRAM circuit complies with a same configuration principle with that of FIG. 5 and FIG. 6, though the memory cell can also use the 8T memory cell structure of FIG. 4. In the circuit structure based on the memory cell of FIG. 4, the resistive-switching devices R_L and R_R of two adjacent memory cells 160 and 162 are respectively connected to the bit line BL(n) and the complementary line BLB(n).

In other words, the switch devices (SW1, SW2) 146 and 148 of the memory 160 connect or disconnect one connection terminals of the resistive-switching devices R_L and R_R to the bit line BL(n). The switch devices (SW1, SW2) 146' and 148' of the memory 162 connect or disconnect one connection terminals of the resistive-switching devices R_L and R_R to the complementary bit line BLB(n). Coupling methods of the other components of the circuit are as that described in the exemplary embodiment of FIG. 5.

Figure 8:
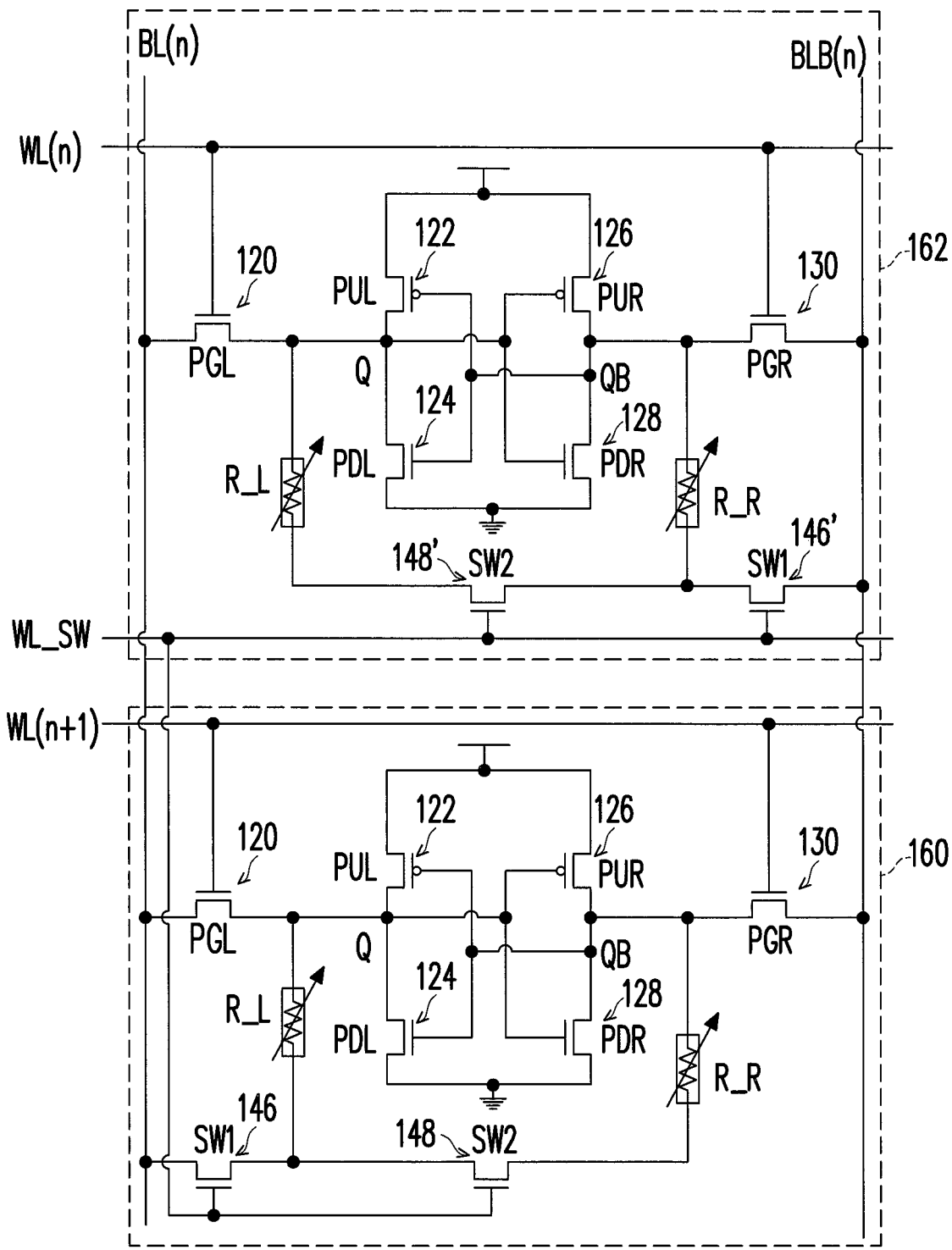
FIG. 8 is a schematic diagram of a NVSRAM circuit according to an exemplary embodiment.

FIG. 8 is a schematic diagram of a NVSRAM circuit according to an exemplary embodiment. Referring to FIG. 8, a structure of the NVSRAM circuit of the exemplary embodiment is similar to that of FIG. 7, though positions the memory cell 160 and the memory cell 162 are exchanged.

Further, considering the load balance of the bit line BL(n)/the complementary bit line BLB(n), regarding the memory cell column formed by a plurality of the memory cells, the number of the memory cells connected to the bit line BL(n) is equal to the number of the memory cells connected to the complementary bit line BLB(n), so as to maintain the load balance of the bit line BL(n)/the complementary bit line BLB(n).

In the following descriptions, since the resistive-switching device can be a unipolar device or a bipolar device, the corresponding operation flows are also different. First, a situation that the resistive-switching device is a bipolar device is taken as an example for description.

Figure 9A:
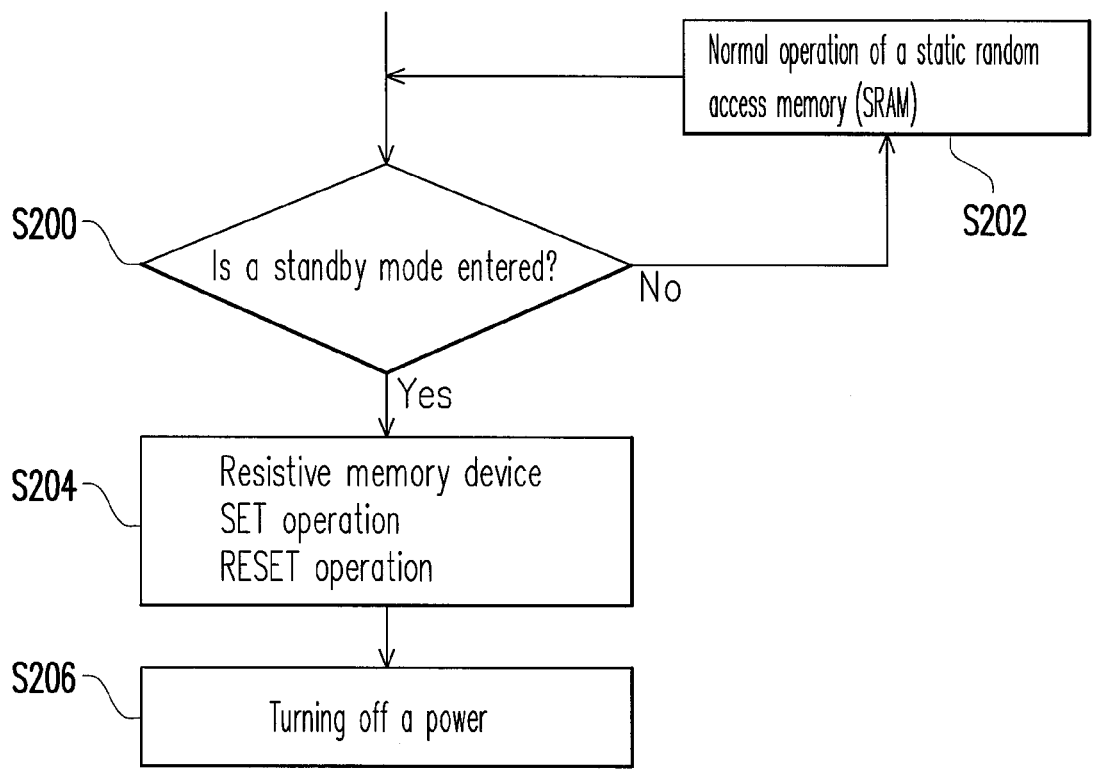
FIGS. 9A-9B are flowcharts schematically illustrating an operation flow of bipolar resistive-switching devices according to an exemplary embodiment.
Figure 9B:
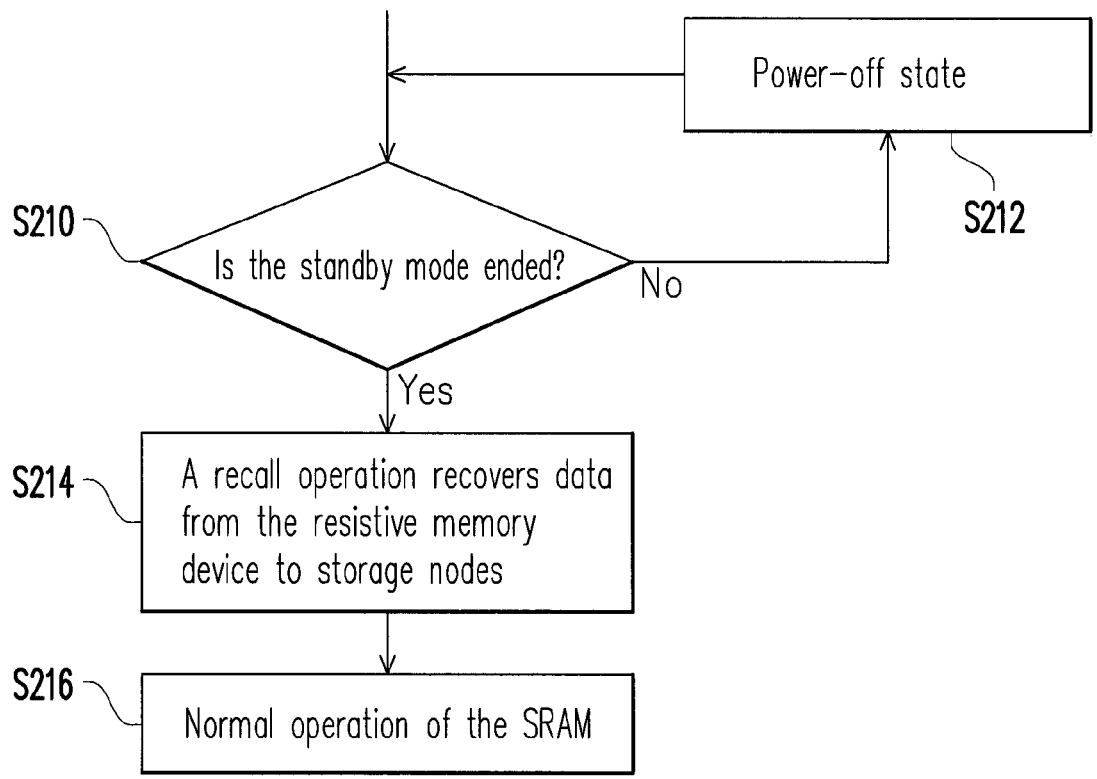

FIGS. 9A-9B are flowcharts illustrating an operation flow of the bipolar resistive-switching devices according to an exemplary embodiment. Referring to FIG. 9A, which illustrates steps that the NVSRAM enters the standby mode. In step S200, it is first determined whether or not to enter the standby mode. If not, in step S202, the normal operation of the NVSRAM is continued. The normal operation includes a read operation and a write operation. During the read and write operations, the switch device is turned off through the switch line WL_SW. i.e. the switch line WL_SW has a low voltage level, and in this way, a circuit effect thereof is the same to the conventional SRAM consisted of six transistors, and the operation speed is not influenced by the resistive memory devices.

If the flow is to enter the standby mode, in step S204, each memory cell stores the stored data to the resistive-switching devices R_L and R_R in form of resistances, which includes the SET operation and the RESET operation. After the storage operation, in step S206, the power is turned off.

Referring to FIG. 9B, which is a boot flow of the NVSRAM. In step S210, it is determined whether the standby mode is to be ended. If the standby mode is maintained, in step S212, the power is maintained to be turned off If the user decides to end the standby mode, in step S214, a recall operation is first executed to recover the resistance information back to the storage nodes of each memory cell in form of voltages. Then, in step S216, the NVSRAM can be normally accessed.

Figure 10:
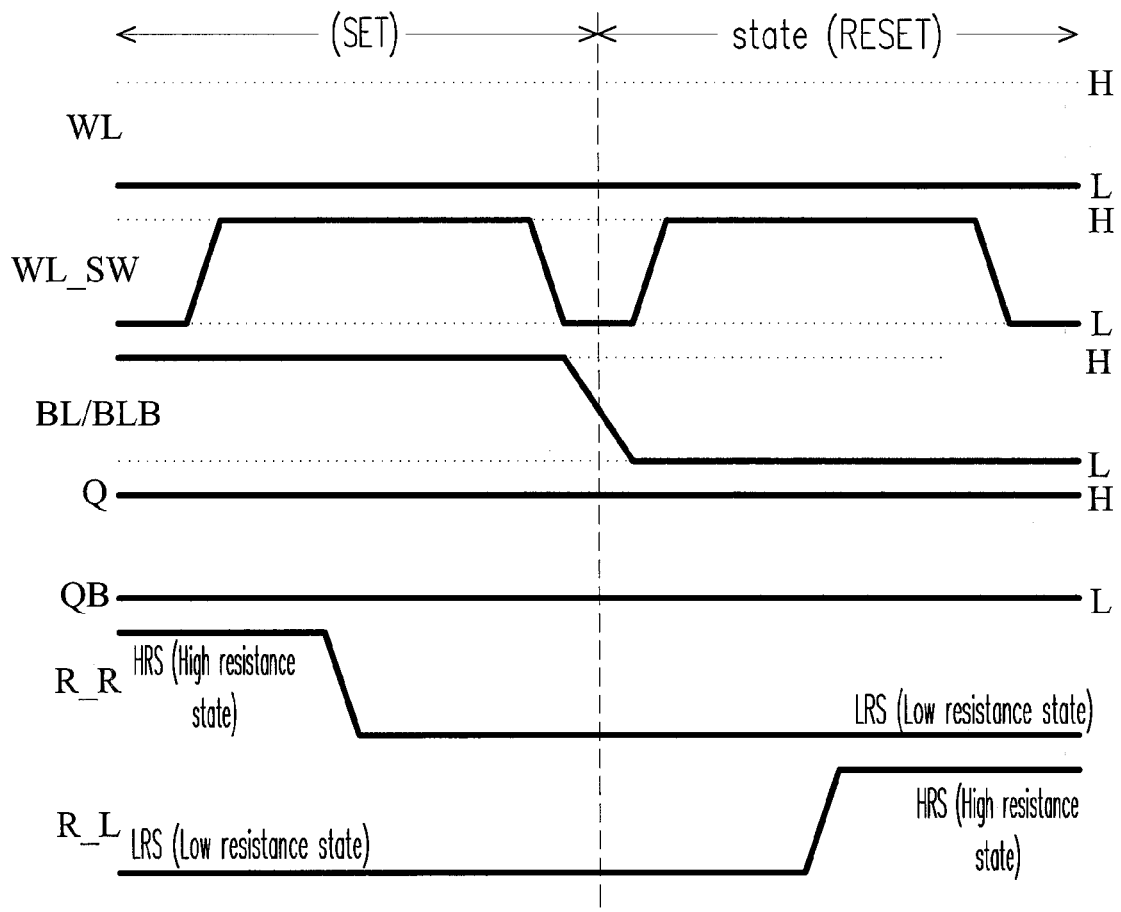
FIG. 10 is a schematic drawing of a waveform of changing resistance states according to an exemplary embodiment.

The operation of changing the resistance is as that shown in FIG. 10. FIG. 10 is a waveform diagram of changing resistance states according to an exemplary embodiment. In the operation of changing resistance, the switch line WL_SW has to have a high level to turn on the switch SW, so that the resistive non-volatile memory device may have enough current or voltage to change the resistance along with different stored data. It is assumed that a voltage of the storage node Q is 1 (a high potential), and a voltage of the storage node QB is 0 (a low potential), in the SET operation, the bit line BL and the complementary bit line BLB are pulled up to the high potential. Now, the resistive-switching device R_R connected to the storage node QB has a positive cross voltage (TE>BE) to change the resistance of the resistive-switching device R_R to a low resistance state. Comparatively, the resistive-switching device R_L does not have a cross voltage, so that the resistance thereof is not changed. In the RESET operation, the bit line BL and the complementary bit line BLB are pulled to the low potential, and the resistive-switching device R_L connected to the storage node Q has a negative cross voltage (TE<BE) to change the resistance of the resistive-switching device R_R to a high resistance state. Comparatively, the resistive-switching device R_R does not have a cross voltage, so that the resistance thereof is not changed. After the SET operation and the RESET operation are completed, the data originally stored in the memory cell is stored in the resistive non-volatile memory devices in form of resistance, and now the power can be turned off to save the power consumption of the standby mode.

Figure 11:
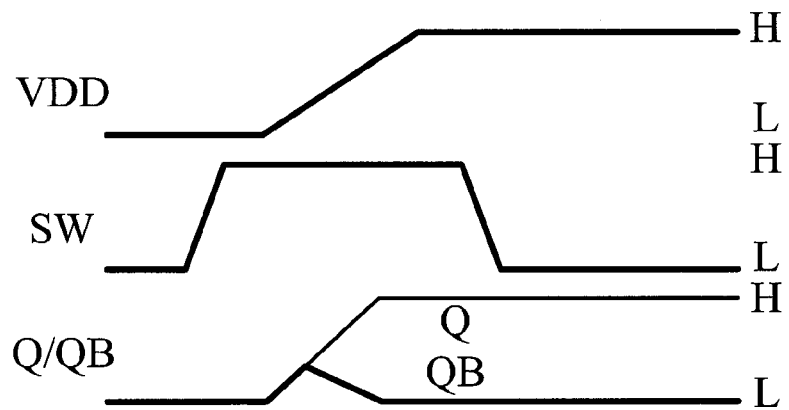
FIG. 11 is a waveform diagram of a recall operation according to an exemplary embodiment.

FIG. 11 is a waveform diagram of the recall operation according to an exemplary embodiment. Referring to FIG. 11, during a power-off period, the voltages on the storage nodes of the memory cell are all discharged to 0V. When the recall operation is executed, the switch line WL_SW is pulled up to the high potential to turn on the switch SW, and then the power supply is recovered. Now, the voltages of the storage node Q and the storage node QB are determined by the resistances of the resistive-switching devices R_R and R_L. When the resistive-switching device R_L has a high resistance state and the resistive-switching device R_R has a low resistance state, a larger current flows through the resistive-switching device R_R, so that the charging current is decreased, and the voltage difference of storage node Q and the storage node QB are developed due to different charging speed, and such voltage difference may lead to a high potential and a low potential of the storage node Q and the storage node QB through a cross-couple latch circuit in the SRAM. In this way, the recall operation is completed to recover the data storage state before the standby mode.

Figure 12A:
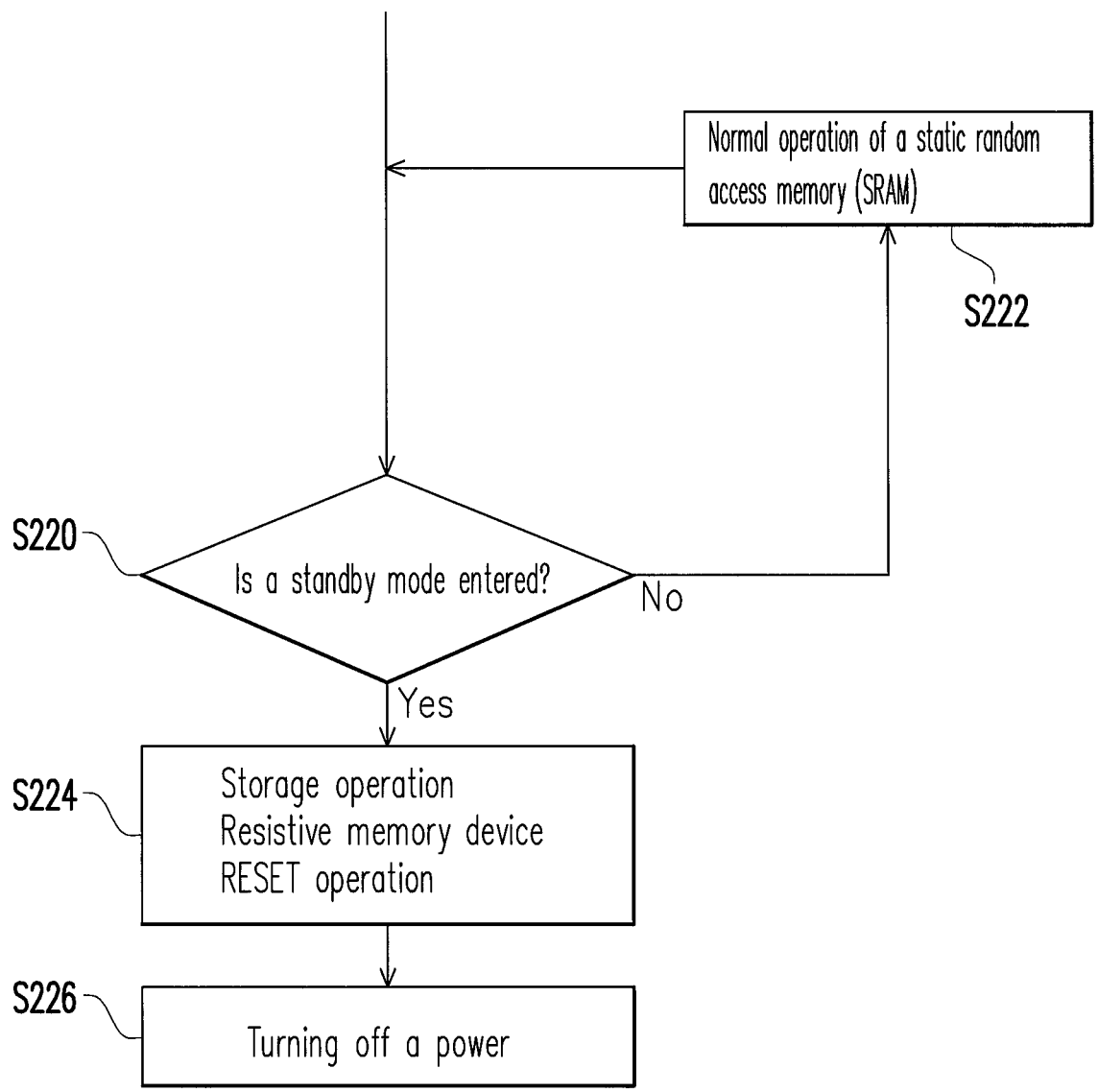
FIGS. 12A-12B are flowcharts schematically illustrating an operation flow of unipolar resistive-switching devices according to an exemplary embodiment.
Figure 12B:
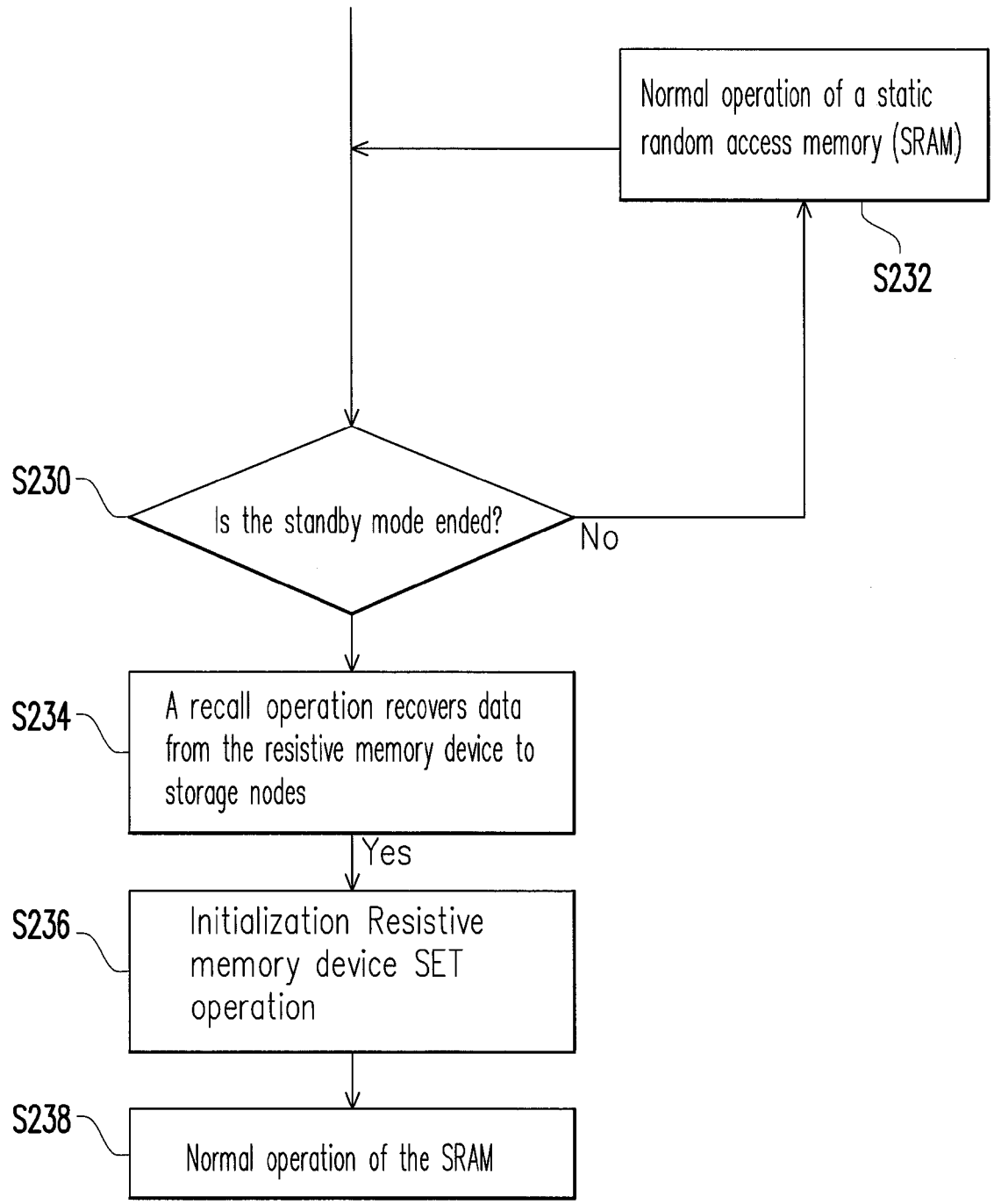

If the resistive-switching device is a unipolar device, the operation flow thereof is different to that of the bipolar device. FIGS. 12A-12B are flowcharts illustrating an operation flow of the unipolar resistive-switching devices according to an exemplary embodiment. Referring to FIG. 12A, which illustrates steps that the NVSRAM enters the standby mode. In step S220, it is first determined whether or not to enter the standby mode. If not, in step S222, the normal operation of the NVSRAM is continued. If the flow is to enter the standby mode, in step S224, the memory cell executes the RESET operation. Then, in step S226, the power is turned off.

Referring to FIG. 12B, which is a boot flow of the NVSRAM. In step S230, it is determined whether the standby mode is to be ended. If the standby mode is maintained, in step S232, the power is maintained to be turned off. If the user decides to end the standby mode, in step S234, the recall operation is first executed to recover the resistance information back to the storage nodes of each memory cell in form of voltages. Then, in step S236, the unipolar resistive-switching device has to be first initialized to execute the SET operation. Then, in step S238, the NVSRAM can be normally accessed.

In summary, in the NVSRAM cell of the disclosure, the switch unit is coupled to the second connection terminals of the first resistive-switching device and the second resistive-switching device, the first resistive-switching device and the second resistive-switching device are switched for conducting to the same one bit line or complementary bit line, so as to improve an operation performance.

It will be apparent to those skilled in the art that various modifications and variations can be made to the disclosed embodiments. It is intended that the specification and examples be considered as exemplary, with a true scope of the invention being indicated by the following claims and their equivalents.

What is claimed is:

1. A non-volatile static random access memory cell, comprising:
    a static random access circuit, having a first terminal and a second terminal respectively having a first voltage and a second voltage, wherein stored data is determined by the first voltage and the second voltage;
    a first storage device, having a first connection terminal and a second connection terminal, wherein the first connection terminal of the first storage device is coupled to the first terminal of the static random access circuit;
    a second storage device, having a first connection terminal and a second connection terminal, wherein the first connection terminal of the second storage device is coupled to the second terminal of the static random access circuit; and
    a switch unit, respectively coupled to the second connection terminal of the first storage device and the second connection terminal of the second storage device, wherein the switch unit is turned on/off in response to a switching signal, and when the switch unit is turned on, the two second connection terminals are directly conducted to a bit line or a complementary bit line corresponding to the bit line by the switching unit, wherein the switching signal is different from a word line signal.

2. The non-volatile static random access memory cell as claimed in claim 1, wherein the static random access circuit comprises:
    a latch circuit unit;
    a first transistor, having a first electrode, a second electrode and a gate, wherein the first electrode is coupled to the bit line, the second electrode is coupled to the latch circuit unit, and the gate is coupled to a word line; and
    a second transistor, having a first electrode, a second electrode and a gate, wherein the first electrode is coupled to the complementary bit line, the second electrode is coupled to the latch circuit unit, and the gate is coupled to the word line.

3. The non-volatile static random access memory cell as claimed in claim 2, wherein the latch circuit unit comprises two inverters.

4. The non-volatile static random access memory cell as claimed in claim 1, wherein the switch unit comprises a single switch device coupled between the second connection terminals of the first storage device and the second storage device, and the bit line or the complementary bit line.

5. The non-volatile static random access memory cell as claimed in claim 4, wherein the switch device is a transistor switch or a diode switch.

6. The non-volatile static random access memory cell as claimed in claim 1, wherein the first storage device and the second storage device respectively have two electrical states under two different bias states for storing data.

7. The non-volatile static random access memory cell as claimed in claim 1, wherein the first storage device and the second storage device are resistive-switching devices, phase-change memory device or magnetoresistive random access memory devices.

8. The non-volatile static random access memory cell as claimed in claim 1, wherein the static random access circuit comprises:
    a latch circuit unit; having the first terminal and the second terminal;
    a first transistor, having a first electrode, a second electrode and a gate, wherein the first electrode is coupled to the bit line, the second electrode is coupled to the first terminal of the latch circuit unit, and the gate is coupled to a word line; and
    a second transistor, having a first electrode, a second electrode and a gate, wherein the first electrode is coupled to the complementary bit line, the second electrode is coupled to the second terminal of the latch circuit unit, and the gate is coupled to the word line.

9. The non-volatile static random access memory cell as claimed in claim 1, wherein the switch unit comprises:
   a first switch device, coupled between the second connection terminal of the first storage device and the bit line, or coupled between the second connection terminal of the second storage device and the complementary bit line; and
   a second switch device, coupled between the second connection terminals of the first storage device and the second storage devices, the second switch device and the first switch device are simultaneously turned on or turned off in response to the switching signal.

10. The non-volatile static random access memory cell as claimed in claim 9, wherein the first switch device and the second switch device are transistor switches or diode switches.

11. The non-volatile static random access memory cell as claimed in claim 9, wherein the first storage device and the second storage device respectively have two electrical states under two different bias states for storing data.

12. A non-volatile static random access memory circuit, comprising:
   a plurality of first memory cells, the same to the non-volatile static random access memory cell as claimed in claim 4, wherein the switch device is connected to the bit line; and
   a plurality of second memory cells, the same to the non-volatile static random access memory cell as claimed in claim 4, wherein the switch device is connected to the complementary bit line,
   wherein the first memory cells and the second memory cells form a memory cell column between the bit line and the complementary bit line.

13. The non-volatile static random access memory circuit as claimed in claim 12, wherein the first memory cells and the second memory cells are arranged in alternation.

14. A non-volatile static random access memory circuit, comprising:
   a plurality of first memory cells, the same to the non-volatile static random access memory cell as claimed in claim 9, wherein the switch device is connected to the bit line; and
   a plurality of second memory cells, the same to the non-volatile static random access memory cell as claimed in claim 9, wherein the switch device is connected to the complementary bit line,
   wherein the first memory cells and the second memory cells form a memory cell column between the bit line and the complementary bit line.

15. The non-volatile static random access memory circuit as claimed in claim 14, wherein the first memory cells and the second memory cells are arranged in alternation.

16. A non-volatile static random access memory circuit, comprising:
   a plurality of first memory cells, the same to the non-volatile static random access memory cell as claimed in claim 1, wherein the switch device is connected to the bit line; and
   a plurality of second memory cells, the same to the non-volatile static random access memory cell as claimed in claim 1, wherein the switch device is connected to the complementary bit line,
   wherein the first memory cells and the second memory cells form a memory cell column between the bit line and the complementary bit line.

* * * * *